ically to said source and drain lines and over said floating gate structures, utilizes a mask through which a stack, formed by a second level polysilicon layer, an interpoly isolating dielectric layer, a first level polysilicon layer and a gate oxide layer, is etched for defining in a longitudinal sense the gate structures (i.e. the channel length) of the EPROM cells. The gate structures are subsequently defined in a transversal sense by etching through another mask a stack comprising a third level polysilicon layer deposited directly over said second level polysilicon layer, said interpoly dielectric layer and said first level polysilicon layer. Said other mask also defines control gate lines running perpendicularly to said parallel drain, source and field oxide lines.

United States Patent [19]

Mazzali et al.

[11] Patent Number: 5,081,056

[45] Date of Patent: Jan. 14, 1992

[54] PROCESS FOR FABRICATING AN EPROM CELL ARRAY ORGANIZED IN A TABLECLOTH ARRANGEMENT

[75] Inventors: Stefano Mazzali; Massimo Melanotte; Luisa Masini; Mario Sali, all of Milan, Italy

[73] Assignee: SGS-Thomas Microelectronics s.r.l., Italy

[21] Appl. No.: 506,309

[22] Filed: Apr. 6, 1990

[30] Foreign Application Priority Data

Apr. 7, 1989 [IT] Italy .................. 83618 A/89

[51] Int. Cl.⁵ .................. H01L 2/336; H01L 21/265
[52] U.S. Cl. .......................... 437/43; 437/49; 437/196; 437/968
[58] Field of Search ............ 357/235; 437/43, 49, 437/52, 195, 48, 196, 968

[56] References Cited

U.S. PATENT DOCUMENTS

| 4,377,818 | 3/1983 | Kuo et al. | 357/23.5 |
| 4,780,424 | 10/1988 | Holler et al. | 437/43 |
| 4,792,925 | 12/1988 | Corda et al. | 357/23.5 |
| 4,935,378 | 6/1990 | Mori | 437/195 |
| 5,005,060 | 4/1991 | Mazzali | 357/23.5 |

Primary Examiner—Brian E. Hearn
Assistant Examiner—C. Chaudhari
Attorney, Agent, or Firm—Pollock, Vande Sande, & Priddy

[57] ABSTRACT

A process for fabricating an integrated memory matrix of EPROM cells having a "tablecloth" organization, with source and drain lines parallel among each other and running between parallel strips of isolating field oxide, floating gate structures formed between said source and drain lines and control gate lines running parallel among each other and perpendicul 3 Claims, 12 Drawing Sheets

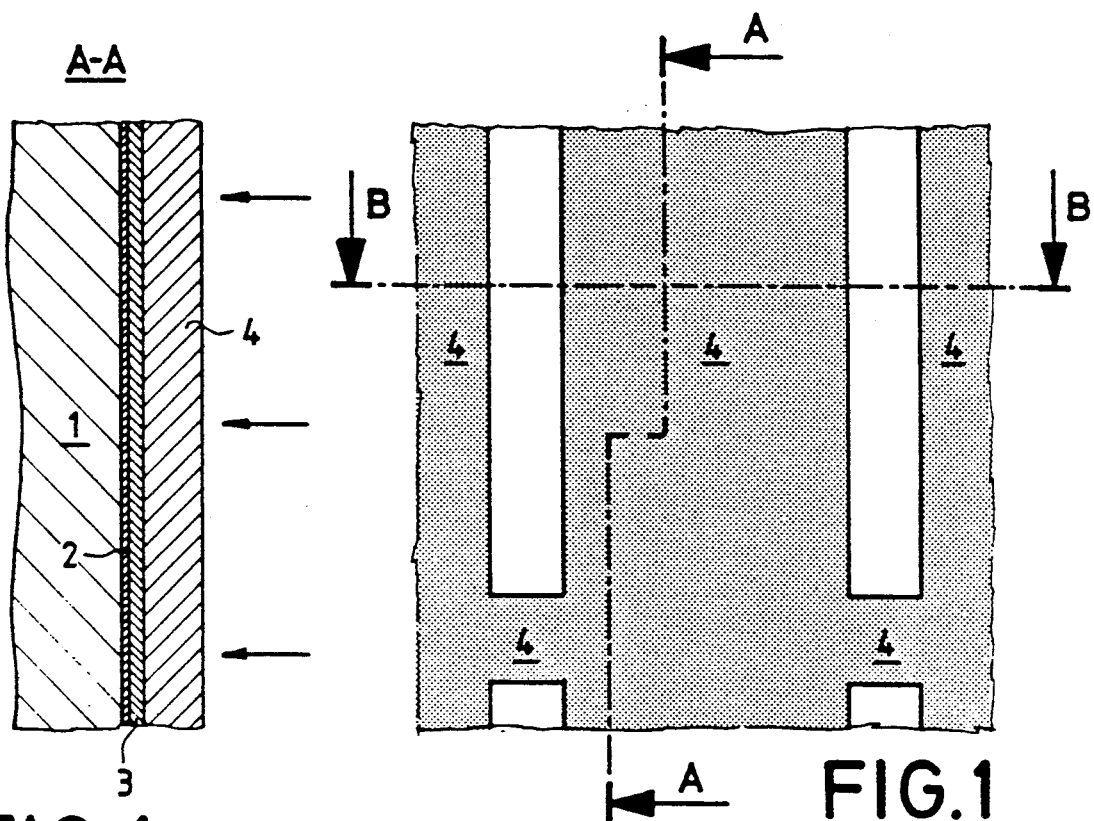
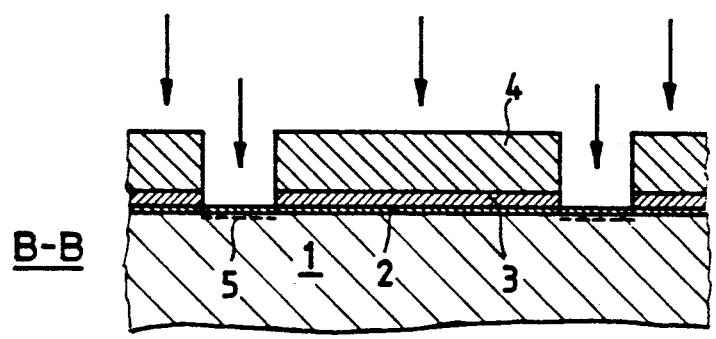

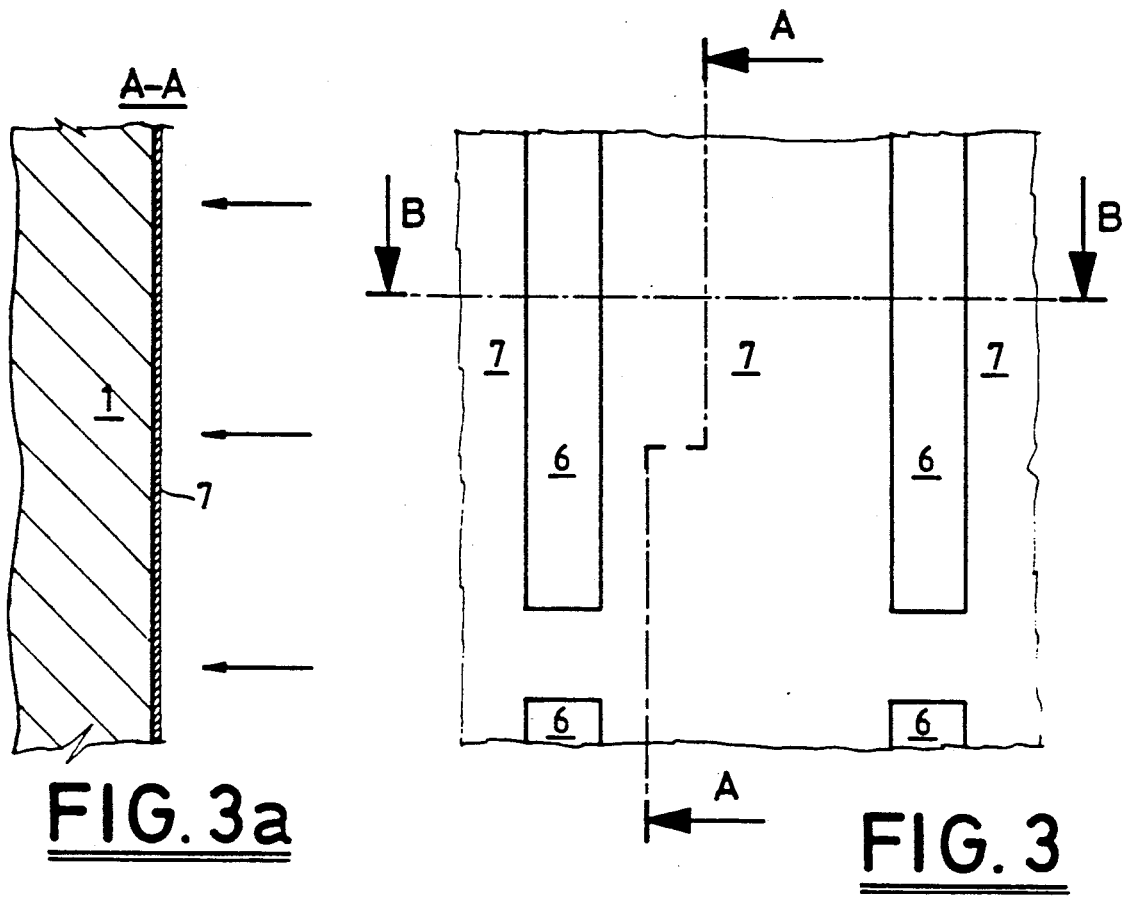
FIG. 3a
FIG. 3
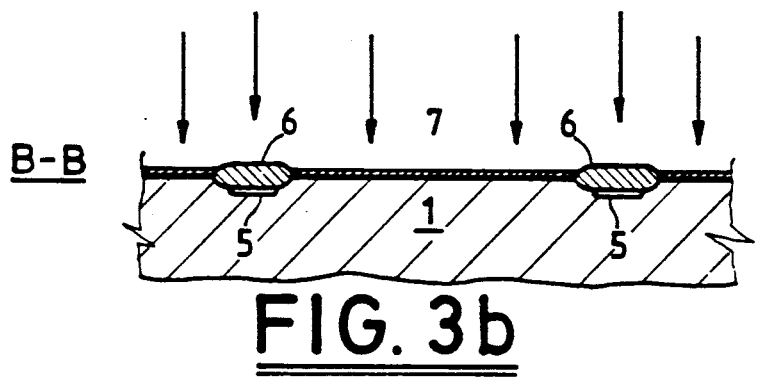
FIG. 3b

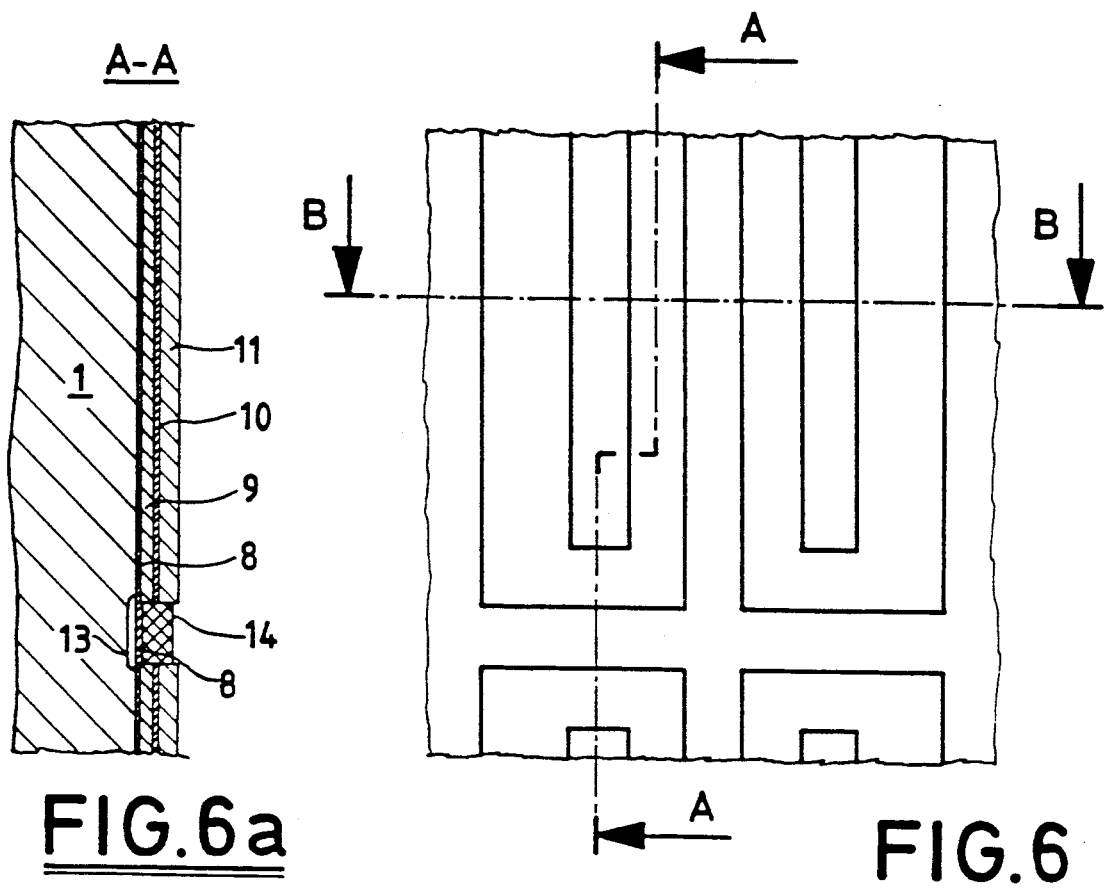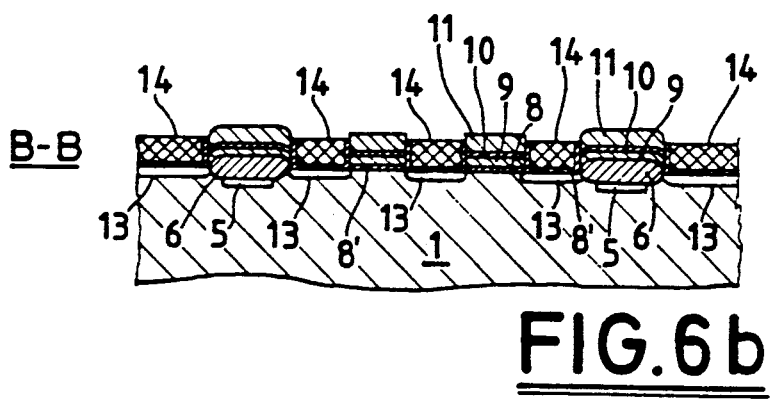

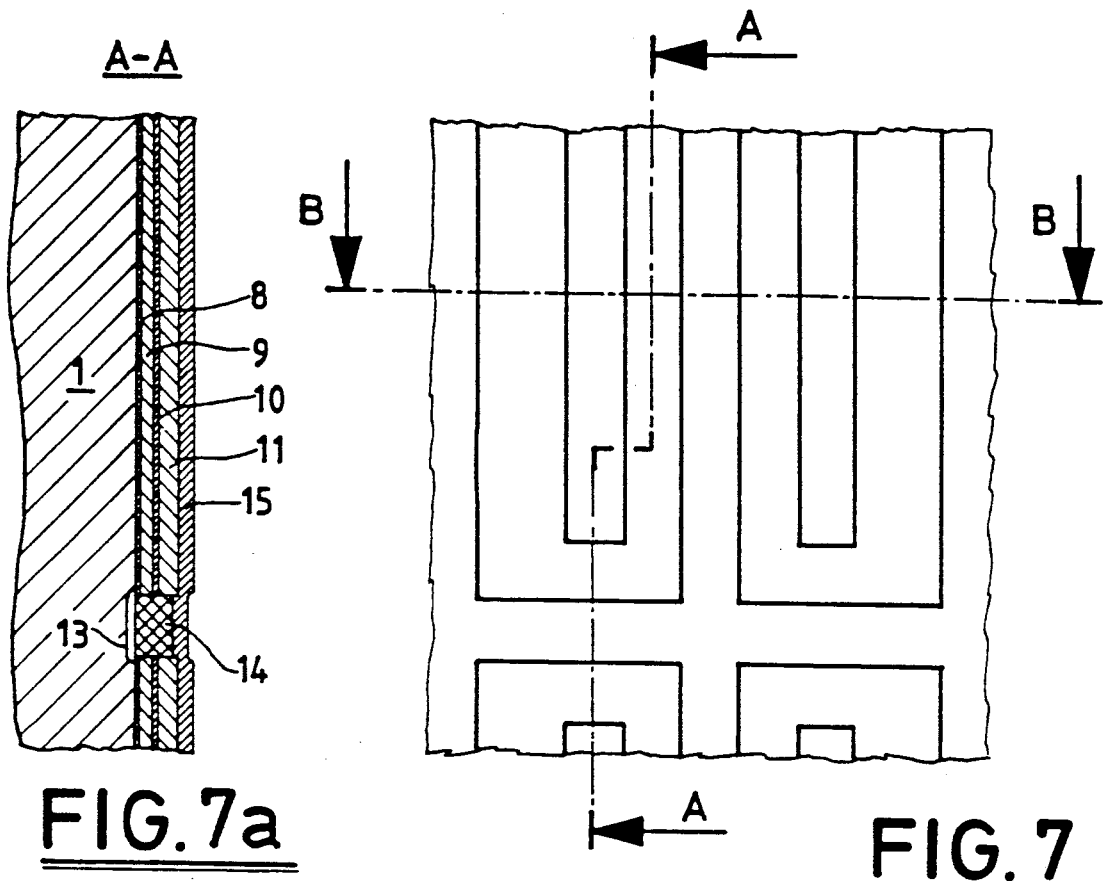
FIG. 7a
FIG. 7
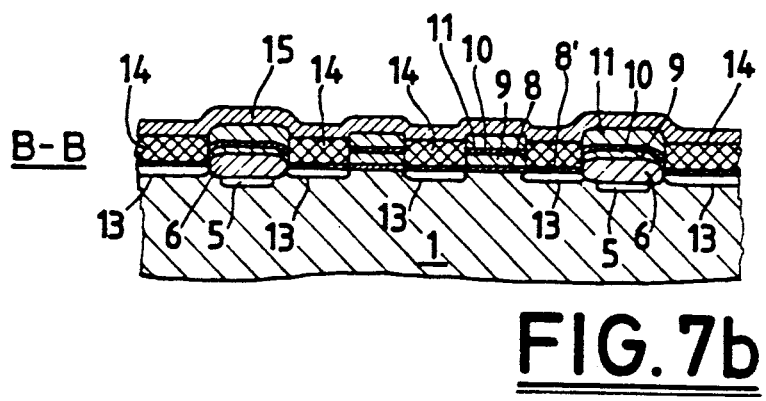
FIG. 7b

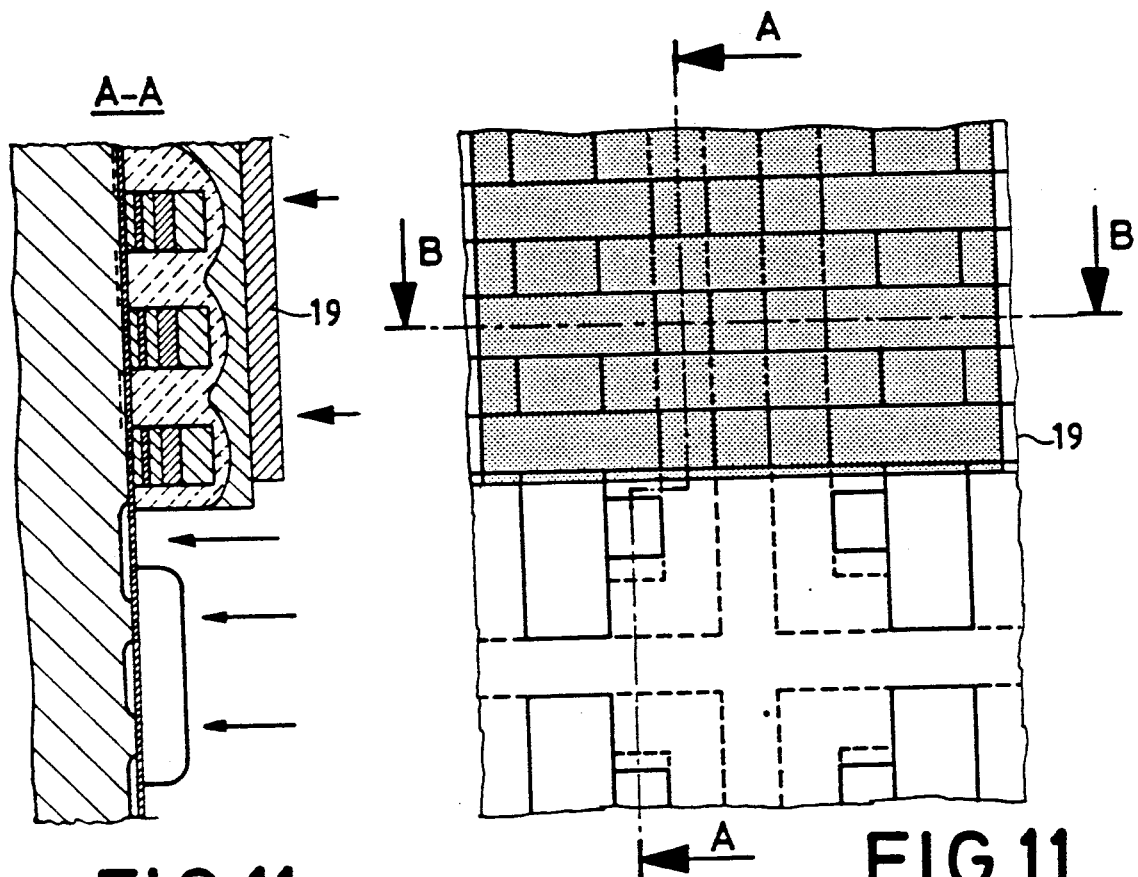
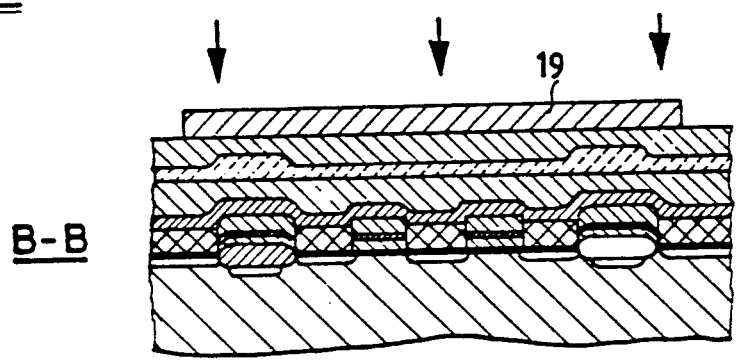
FIG.11a
FIG.11
FIG.11b

PROCESS FOR FABRICATING AN EPROM CELL ARRAY ORGANIZED IN A TABLECLOTH ARRANGEMENT

BACKGROUND OF THE INVENTION

1. FIELD OF THE INVENTION

The present invention relates to an integrated memory array of EPROM cells organized in a "tablecloth" arrangement and to the process for fabricating it.

In the fabrication of a memory matrix, particularly of EPROM cells, an important goal is to maximize cell density in order to improve performance and exploit better the available semiconductor area. This imposes the development and adoption of advanced technologies, especially in the photolithographic field, with the ability to define patternings with submicrometric dimensions, e.g. 0.8 μm. Notwithstanding improvements in the photolithographic area it is increasingly becoming difficult to compact the cells any further, therefore R & D efforts have been oriented toward new types of architecture Which may help to increase cell density.

2. DESCRIPTION OF THE PRIOR ART

In the specific field of EPROM cells, a greater density could be achieved by passing from a conventional configuration with pairs of control gate lines running over and aligned with floating gate structures and with parallel source lines running therebetween, while drain contacts are realized between the control gate lines of each pair, to a so-called "tablecloth" configuration using parallel and alternately arranged source and drain lines with floating gates formed between adjacent source and drain lines, and control gate lines parallel among each other and running perpendicularly to said source and drain lines, over and aligned with said floating gates.

This latter configuration is described in the prior U.S. patent application Ser. No. 783,650, now U.S. Pat. No. 4,792,925, filed on Oct. 3, 1985, and has advantages in respect to a traditional configuration in terms of an easier dimensional control of the patterning steps and a remarkable degree of cell density can be achieved. An accompanying decodification complexity for addressing individual cells has played against a commercial exploitation of this new configuration.

In order to overcome this drawback, in a subsequent U.S. patent application Ser. No. 369,132, now abandoned, filed on June 21, 1989, a modified "tablecloth" EPROM cell array was described. This array had spaced, parallel and alternately arranged source and drain lines, floating gate areas realized between said source and drain lines and control gate lines parallel among each other and running perpendicularly to said source and drain lines and over said floating gate areas and was characterized by comprising isolating strips of field oxide running parallel to and alternately with said spaced, parallel source and drain lines in order to divide the matrix into electrically isolated groups of cells comprising two drain lines and a source line running therebetween and spatially connected by floating gate areas over which relative control gate lines run.

In this way individual access to single cells was made possible by a conventional decodification.

The division of the cells in isolated groups determined by the field oxide strips made possible a positive selection of one cell at the time, by applying a certain voltage to the appropriate drain and control gate lines while grounding all the source lines of the matrix. The field oxide prevented the voltage applied to the selected drain line to affect other cells associated to the same control gate line and therefore singled-out the addressed cells. In a global production economy of this kind of memories, the fabrication process itself has a remarkable importance from the point of view of the yield and reliability of the products as well as from a non-negligeable point of view of the cost of production.

OBJECTIVE AND SUMMARY OF THE INVENTION

An object of the present invention is to provide a fabrication process for a "tablecloth", EPROM cell memory matrix using a reduced number of masks in respect to known fabrication processes for these devices.

The process of the invention advantageously utilizes a reduced number of masks by employing a single "sandwich" mask for etching a "stack" (or multistrate) formed by a gate oxide layer, a first level (floating gate) polycrystalline silicon layer, an insulating layer (customarily formed on the surface of the first level polysilicon layer by thermally oxidizing the polysilicon or by depositing thereon an Oxide-Nitride-Oxide, ONO, multilayer) and by a second level (control gate) polycrystalline silicon layer. After this etching of the stack of superimposed layers, which also define the "channel length" of the cells, the source and drain areas are implanted (N+) and the silicon surface on the implanted areas is reoxidized (together with the flanks of the gate lines defined by etching the stack), before depositing a first insulating layer of oxide using a tetraethylorthosilicate (TEOS) and after a planarization layer (e.g. a spun-on-glass, commonly known as a SOG layer). Alternatively, the implantation of the source and drain area may take place after a silicon reoxidation heat treatment in order to limit the lateral diffusion of the dopant of the source and drain junctions under the gate structure of the cells. According to a further embodiment, a thin TEOS layer may be deposited after the thermal reoxidation of silicon and anisotropically etched in a RIE plasma in order to leave thin lateral spacers along the flanks of the gate lines before carrying out implantation (N+) of the source and drain areas which become laterally defined by said spacers. Implantation of the dopant, effected in an area purposely backed-off from the side of the patterned first level polysilicon layer constituting the floating gate, prevents the lateral diffusion front of the dopant from encroaching into the silicon region projectively underneath the polysilicon gate. A second stack etching step defines the gate structure in a transversal sense and the control gate lines running perpendicularly to source, drain and field oxide lines.

BRIEF DESCRIPTION OF THE DRAWINGS

Characteristics and advantages of the present invention will become evident through the following detailed description of a preferred embodiment thereof, illustrated in the attached drawings, wherein: the series of FIGS. from 1, 1a and 1b, to 12, 12a and 12b, depicts the process of the invention through partial schematic plan and, respectively orthogonal elevation cross sections of the device being fabricated.

DESCRIPTION OF THE PREFERRED EMBODIMENT

The figures refer case of the fabrication of a "tablecloth", EPROM cell memory matrix as described in the cited prior U.S. patent application Ser. No. 369,132, the structural and functional description of which is here incorporated by express reference. Of course, as it will be obvious to the skilled technician, the process of the invention is also applicable for fabricating "tablecloth" type memory matrices with "offset" EPROM cells, as the one structurally and functionally described in a prior U.S. patent application Ser. No. 326,809, now U.S. Pat. No. 5,005,060, the description of which is intended to be incorporated here by express reference.

With reference to the figures, as in a common EPROM cells fabrication process, the surface of a monocrystalline P-type silicon wafer 1 is thermally oxidized for growing a relatively thin layer of silicon oxide (PAD Oxide) 2. On this layer of oxide a silicon nitride layer 3 is deposited. On the surface of the deposited nitride layer 3, a first, ACTIVE AREAS, photoresist mask 4 is formed. After having etched the nitride layer 3 through the mask 4, boron (5) is implanted for forming the isolation structures, as depicted in FIGS. 1, 1a and 1b.

Figure 2A:
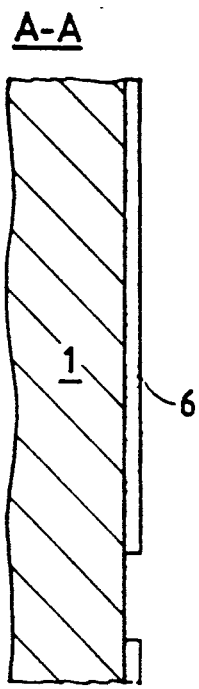
Figure 2:
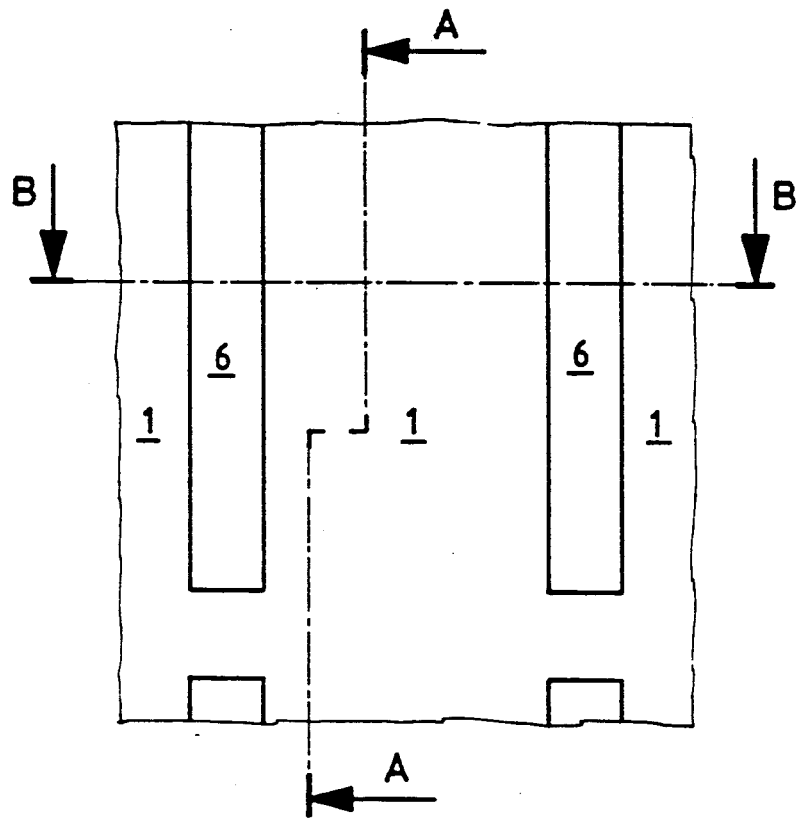
Figure 2B:
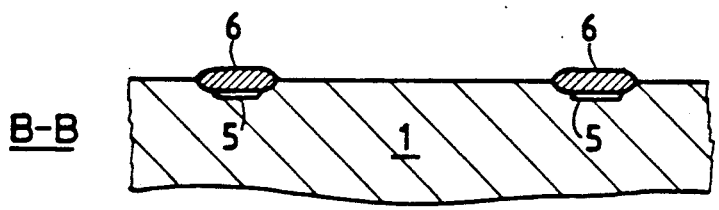

After having removed the residual masking photoresist, a field oxidation heat treatment is carried out until a thick isolation layer of oxide 6 is grown in the areas unmasked by the patterned nitride layer. After having grown the field oxide 6, a plasma etching is performed for completely removing the patterned silicon nitride layer and the underlying PAD oxide layer 2. FIGS. 2, 2a and 2b, show the wafer at this point of the fabrication process.

At this point, an optional sacrificial oxidation of the silicon surface for forming a thin layer of oxide 7 may be performed and through a so-called EPROM mask (not shown in the figures) which delimits the superficial area of the wafer in which the matrix of EPROM cells is to be formed, an acceptor-type dopant (boron) is implanted in order to favor the generation of "hot" electrons. These steps of the process are schematically depicted in FIGS. 3, 3a and 3b.

Figures 4, 4A:
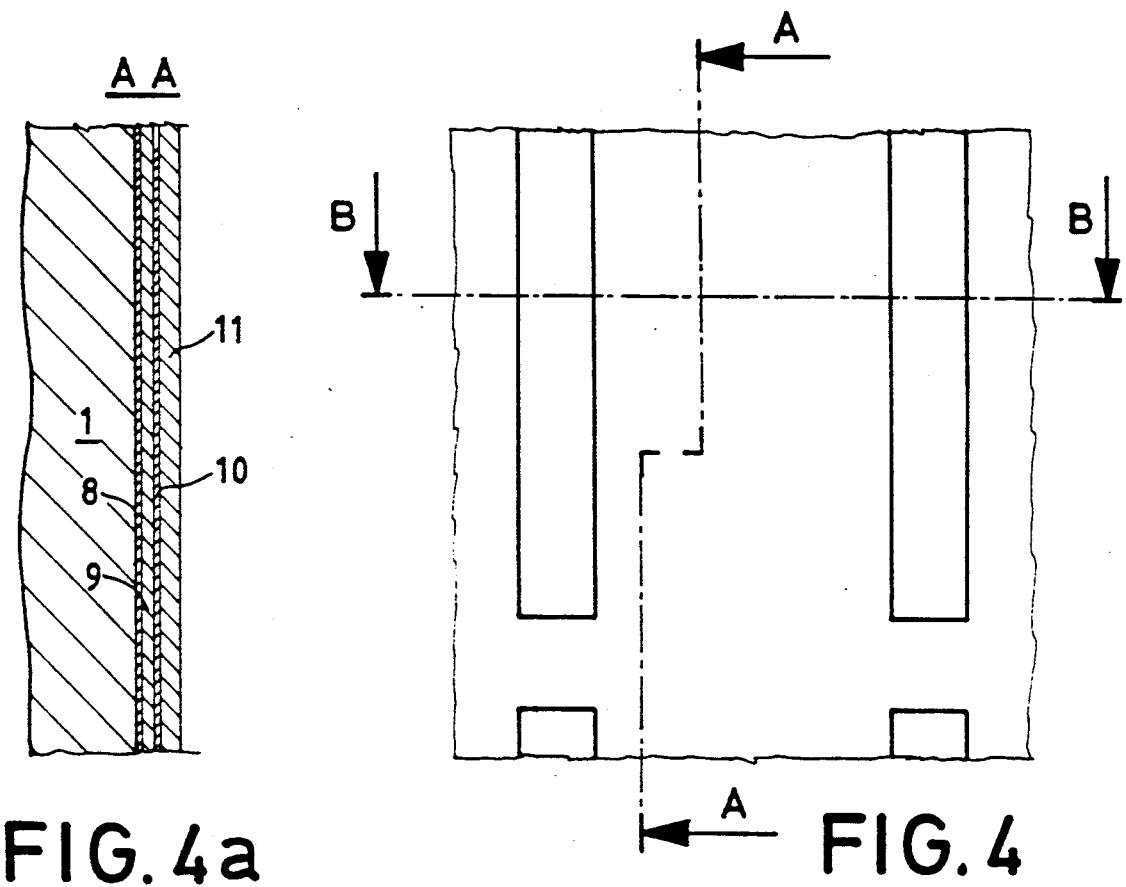
Figure 4B:
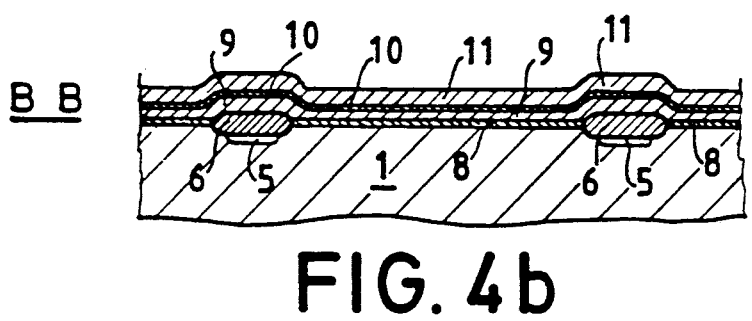

After having removed the resist of the EPROM mask (not shown in the figures) a gate oxide layer 8 is formed followed by the deposition of a first level layer of polycrystalline silicon (polysilicon or poly 1) 9, which, after having been doped with phosphorous in order to increase its electrical conductivity, is superficially oxidized in order to form a dielectric oxide layer 10 over which a second level (poly 2) of polycrystalline silicon 11 is deposited, which will be electrically insulated from the underlying first level polysilicon. These steps are schematically depicted in FIGS. 4, 4a and 4b.

Optionally the electric isolation layer between the two superimposed layers of polysilicon may be formed by depositing a multilayer constituted by a first silicon oxide layer, followed by a second layer of silicon nitride and by a third layer of silicon oxide (ONO) over which said second layer of polycrystalline silicon (poly 2) is deposited.

Figures 5, 5A:
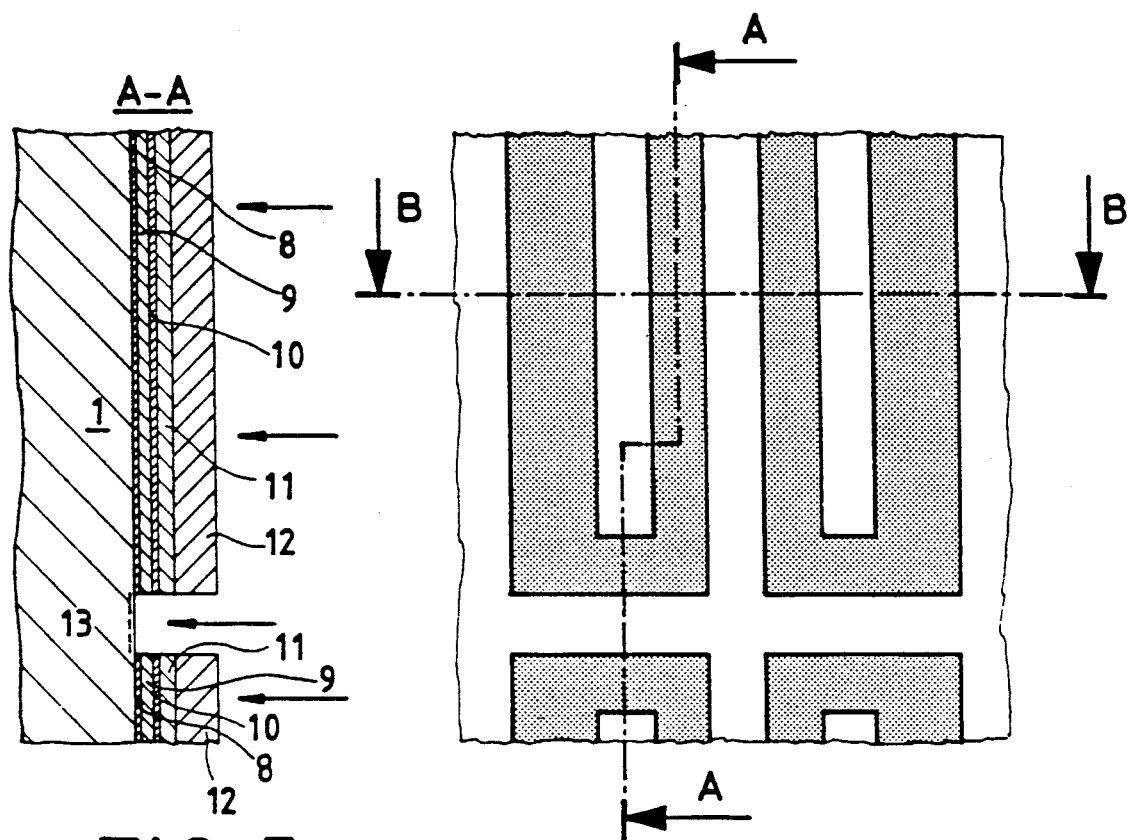
Figure 5B:
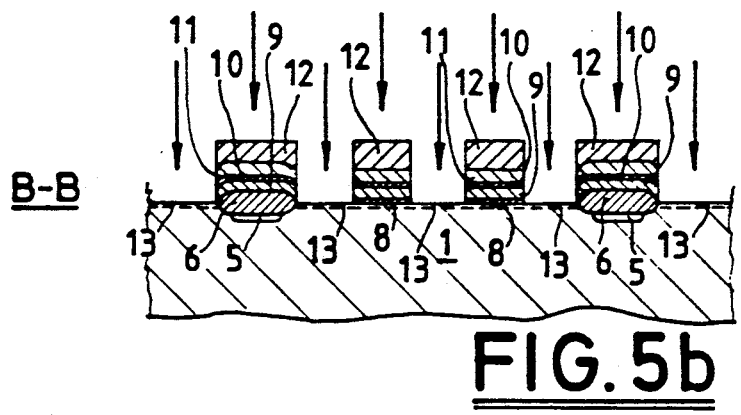

A SANDWICH photoresist mask 12 is formed for defining in a longitudinal sense the distinct gate areas, i.e. the "channel length" of the cells, and through this mask the stack or multilayer comprising the gate oxide 8, the first level polysilicon 9 (floating gate), the insulating layer 10 and the second level polysilicon 11 (control gate) is etched in a RIE plasma. As shown in FIGS. 5, 5a and 5b, the etching is followed by an implantation of arsenic 13 through the same mask in order to form the N+ source and drain junctions of the EPROM cells.

After having removed the residual masking photoresist, the silicon in the source and drain areas is thermally reoxidized and so are also oxidized the exposed lateral (etched) surfaces of flanks of the first level and of the second level polysilicon layers.

In order to reduce the extent of lateral diffusion of the source and drain N+ junctions, the relative arsenic implantation 13 may also be effected after the reoxidation heat treatment.

According to another alternative embodiment of the process of the invention, a thin conformally deposited silicon oxide layer (e.g. a TEOS layer of few hundred Angstroms) may be deposited and RIE plasma etched in order to form thin tapered spacing residues of TEOS (spacers) on the flanks of the gate structures, which spacers will have the function of further backing-off from the flank of the gate structure the subsequent arsenic implantation in order to limit laterally the extent of diffusion and therefore the profile of the N+ drain and source junctions, thus preventing the diffusion front from excessively encroaching below the polysilicon gate structures.

In all cases, after having formed the drain and source junction and reoxidized the silicon surface in the drain and source areas, a conformally deposited oxide layer is deposited from a tetraethylorthosilicate (TEOS) or using an equivalent conformal deposition technique (vapox or PSG deposition) followed by the deposition of a second dielectric layer of a planarization material such as an amorphous spun-on silicon oxide (SOG) and a planarizing anisotropic RIE plasma etching is conducted until the second level polysilicon 11 is exposed. Once this isolation and planarization procedure is completed, the device is as shown in FIGS. 6, 6a and 6b, wherein the residue 14 of the isolation and planarization layers of TEOS and of SOG is visible.

On the planarized surface of the wafer a so-called MATRIX photoresist mask is formed for patterning the second level polysilicon 11 and through this mask the latter is etched until also the underlying electrical isolation layer 10 between the two levels of polysilicon is removed in the area outside the perimeter of the area occupied by the matrix of memory cells. After having removed the residual masking photoresist, a third level of polycrystalline silicon 15 is deposited in electrical continuity with the previously patterned second level polysilicon layer. The accumulated layers deposited on the rear of the wafer (poly+oxide+poly+oxide+poly+oxide) are removed and the third level polysilicon layer (and through the latter also the underlying second level polysilicon) is doped with phosphorous and a silicide layer 16 is deposited on the doped third level polysilicon 15. At this point of fabrication the wafer is as shown in FIGS. 7, 7a and 7b.

Figure 8A:
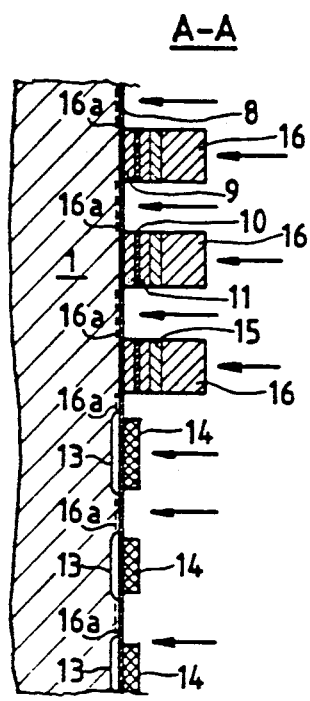
Figure 8:
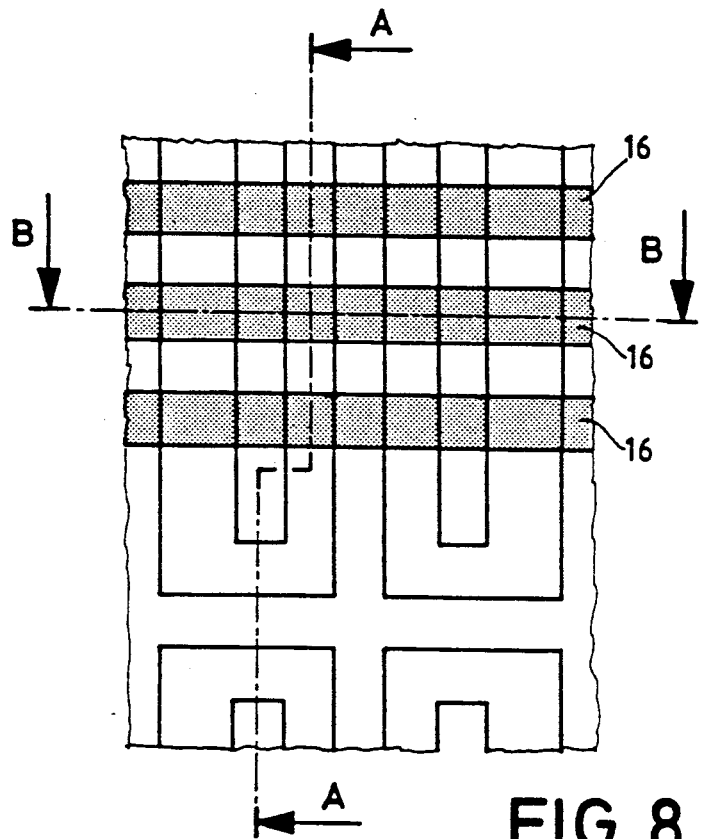
Figure 8B:
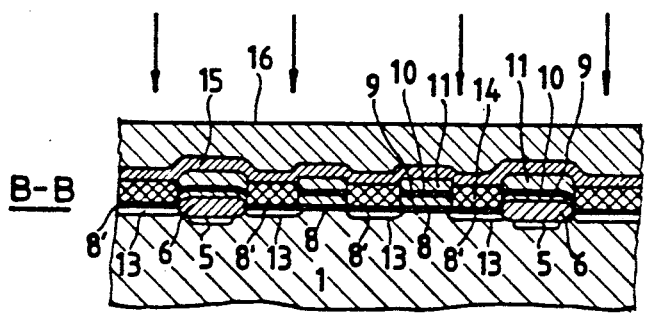

A so-called GATE photoresist mask 16 is formed and through this mask the silicide layer 16, the third level polysilicon layer 15 and the second level polysilicon layer 11 are etched and, under substantially self-alignment conditions, the etching is protracted for removing the isolation layer 10 and also the underlying first level polysilicon 9. An enrichment implantation 16a may then be carried out, as depicted in FIGS. 8, 8a and 8b.

Through this last masking and etching operation the control gate lines (word-lines) of the "tablecloth" type matrix are defined. These control gate lines are represented by the patterned strips of third level polysilicon 15 which run perpendicularly to the source and drain lines 13, to the aligned floating gate areas 9 and to the field oxide strips 6 which divide the matrix into electrically isolated groups of cells formed between two adjacent field oxide strips. Concurrently the first level polysilicon 9 and the second level polysilicon 11, isolated from each other by the dielectric layer 10, are defined in a transversal sense, thus generating small squares of first level polysilicon (poly 1), which constitute the floating gates of as many memory cells and of second level polysilicon (poly 2), superimposed and electrically isolated from the underlying small square of poly 1, which are contacted by a respective line (word line) of third level polysilicon (poly 3). The small squares of poly 2 act as a control gate structure for the underlying floating gate of poly 1 and are electrically biased by means of the control gate lines of poly 3.

Figures 9, 9A:
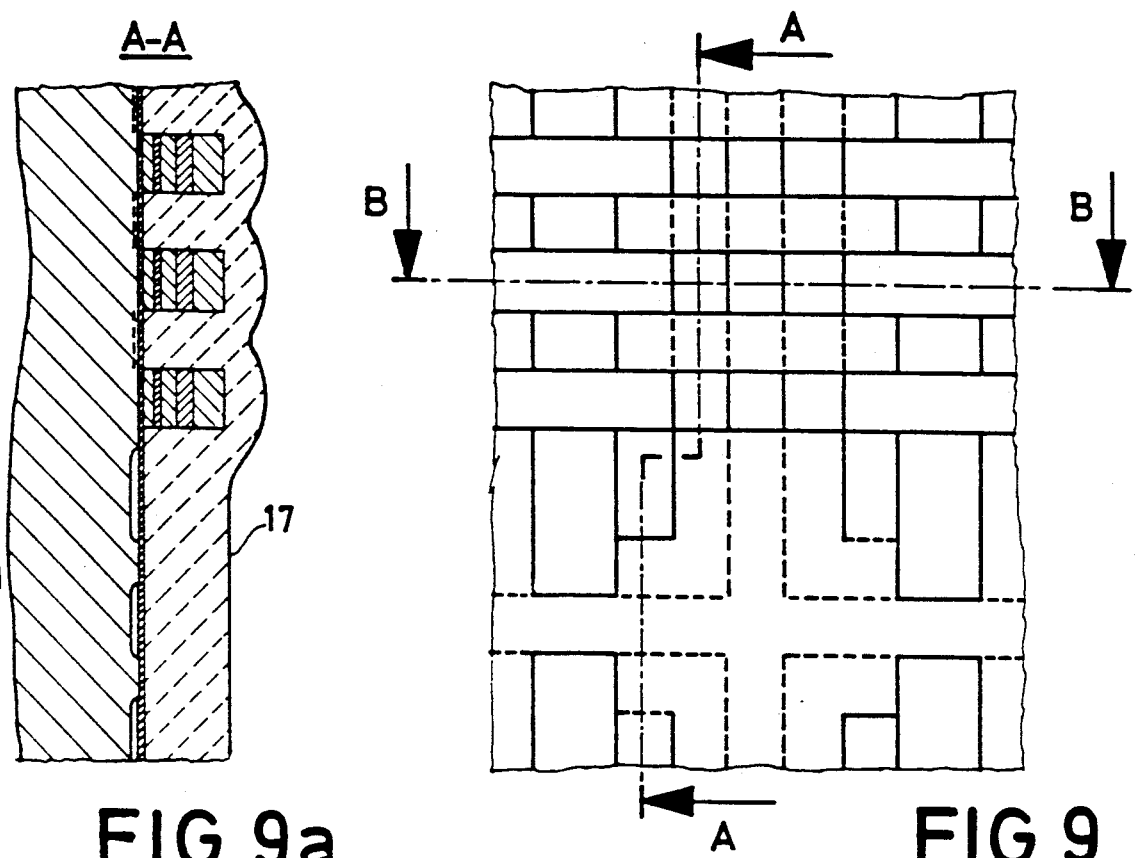
Figure 9B:
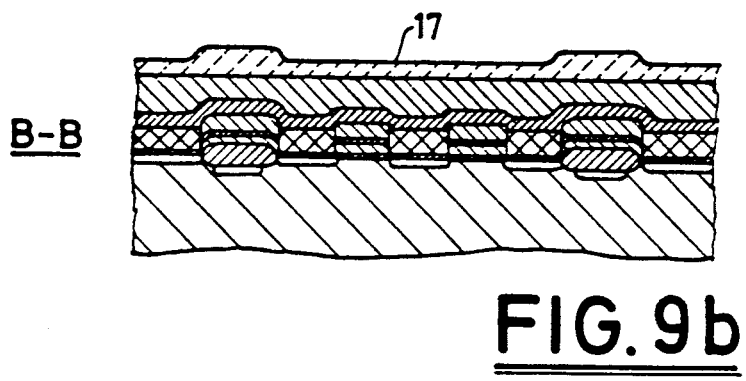

The residual masking resist is removed and the source and drain areas are re-oxidized. Deposition of a vapox or a PSG (phosphorous silicon glass) layer is performed followed by the deposition of a PBSG layer (phosphorous-boron-silicon glass) and a thermal "reflow" treatment of these passivating dielectric layers which are unitarily indicated with 17 in FIGS. 9, 9a and 9b.

Figure 10A:
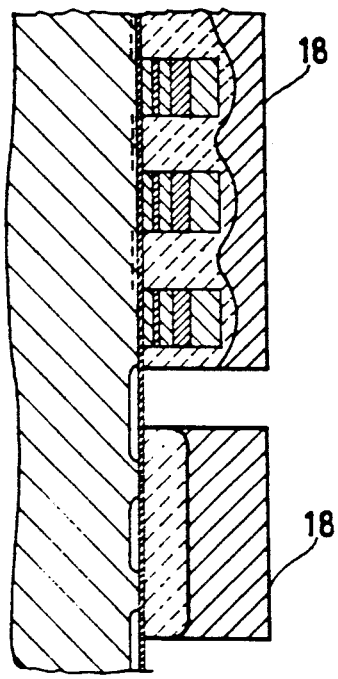
Figure 10:
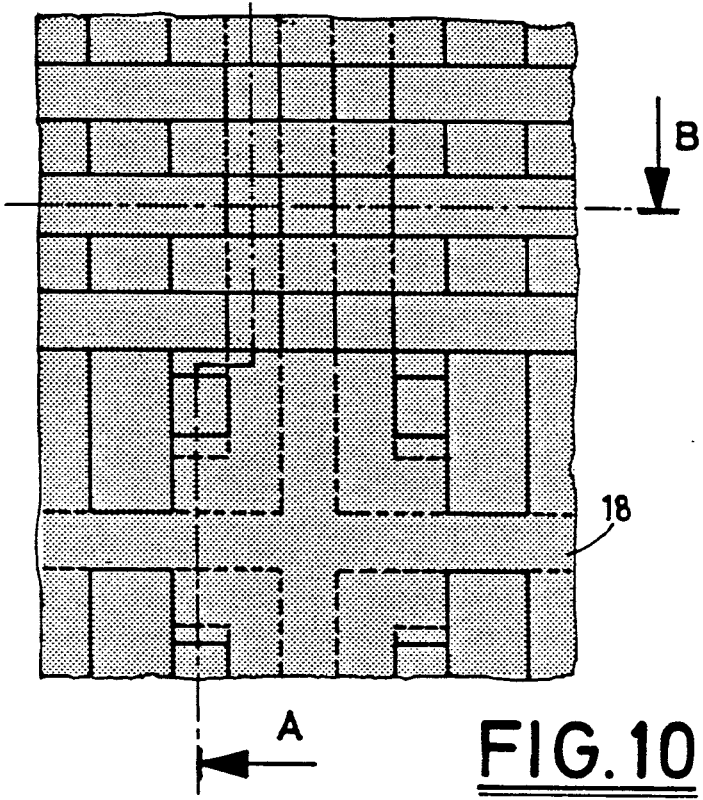
Figure 10B:
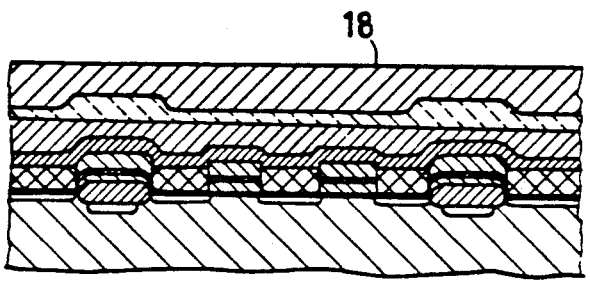

The fabrication process continues with the formation of a so-called CONTACT photoresist mask 18 and with the etching of the dielectric passivating layer until exposing the monocrystalline silicon, as shown in FIG. 10, 10a and 10b.

After having removed the residual masking photoresist 18, a further CONTACT IMPLANTATION mask 19 may be formed for implanting the contact areas, as depicted in FIGS. 11, 11a and 11b.

After having removed the masking photoresist 19, an OPEN CONTACT reflow heat treatment may be carried out followed by a cleaning treatment of the contact areas and by the sputter deposition of a metal layer 20.

Figures 12, 12A:
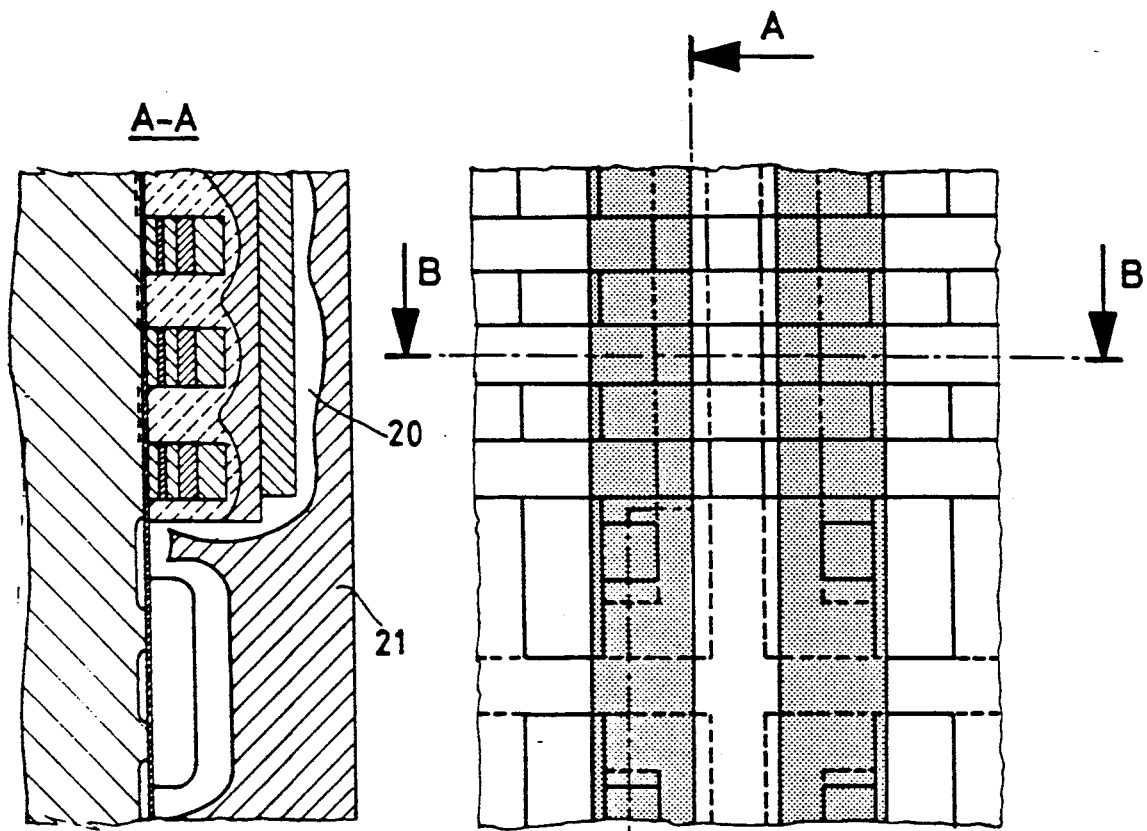
Figure 12B:
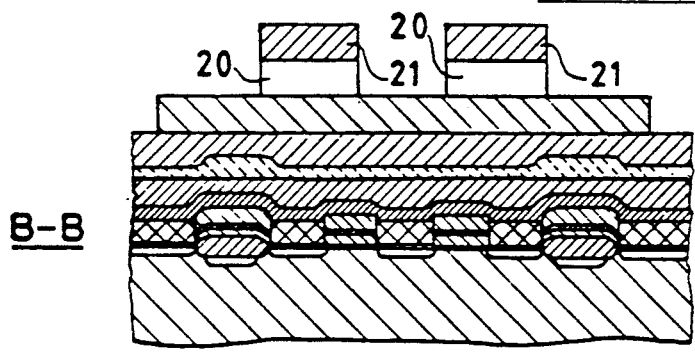

Finally a so-called METAL photoresist mask is formed for patterning the deposited metal by plasma etching, as depicted in FIGS. 12, 12a and 12b.

What we claim is:

1. A process for fabricating an integrated EPROM cell memory matrix having source and drain lines parallel among each other between parallel strips of isolation field oxide, floating gate areas between said source and drain lines, control gate lines parallel among each other and running perpendicularly to said source and drain lines and over said floating gate areas, which comprises oxidizing the surface of a monocrystalline silicon wafer, depositing a nitride layer, masking the active cell areas, patterning by etching through the mask said nitride layer and implanting field isolation areas, removing the residual masking resist, growing an isolation field oxide, etching the patterned nitride layer and the underlying oxidized silicon layer, masking the area destined to the formation of said integrated matrix, implanting active areas of the EPROM cells, removing the masking resist, forming a layer of gate oxide over the active areas and depositing a first layer of polycrystalline silicon, doping said polycrystalline silicon, and characterized by comprising the following steps a) forming an electrically insulating dielectric layer over the surface of said first layer of deposited polycrystalline silicon;

b) depositing a second layer of polycrystalline silicon;

c) forming a photoresist mask defining in a longitudinal sense a gate structure of said EPROM cells;

d) etching through said photoresist mask the stack of layers formed by said second polycrystalline silicon layer, said dielectric insulating layer, said first polycrystalline silicon first layer and said gate oxide layer;

e) implanting and reoxidizing the source and drain areas adjacent to said longitudinally defined gate structure of the EPROM cells, and f) conformally depositing an isolation dielectric layer, depositing a planarization layer of dielectric material, etching said planarization layer and said conformally deposited isolation layer until exposing the surface of said second layer of polycrystalline silicon, masking the area occupied by said matrix of EPROM cells, etching the second layer of polycrystalline silicon and said electrically insulating layer, removing the residual masking resist, and further characterized by comprising the following steps:

i) depositing a third layer of polycrystalline silicon;

ii) doping said third layer of polycrystalline silicon and through the latter also the contiguous underlying second layer of polycrystalline silicon;

iii) depositing a silicide layer;

iv) forming a photoresist mask for defining, in a transversal sense, said gate structure of the EPROM cells and said control gate lines;

v) etching through the latter photoresist mask a second stack formed by said silicide layer, said third layer of polycrystalline silicon for patterning said control gate lines and said second layer of polycrystalline silicon, and continuing the etching, in a substantially self-alignment condition, of the said electrically insulating layer and of said first layer of polycrystalline silicon for patterning said gate structures in a transversal sense;

vi) performing a further isolation enrichment implantation of the source and drain areas of the monocrystalline silicon exposed by the preceding etching of the said second stack of layers.

2. The process of claim 1 which further comprises:
performing a further isolation enrichment implantation of the source and drain areas of the monocrystalline silicon exposed by the etching of the said second stack of layers;
removing the residual masking photoresist, reoxidizing said exposed and further implanted source and drain areas of the cells, depositing a layer of dielectric material and forming source and drain contacts and connecting, metal, source and drain lines.

3. The process of claim 1 which further comprises oxidizing the etched flanks of said layers of polycrystalline silicon of said longitudinally defined gate structure.

* * * * *